(12) United States Patent
Gu

(10) Patent No.: US 7,071,789 B2
(45) Date of Patent: Jul. 4, 2006

(54) CROSS COUPLED VOLTAGE CONTROLLED OSCILLATOR

(75) Inventor: Richard X. Gu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 9 days.

(21) Appl. No.: 10/828,676

(22) Filed: Apr. 21, 2004

(65) Prior Publication Data

US 2005/0237122 A1 Oct. 27, 2005

(51) Int. Cl.
*H03K 3/03* (2006.01)
*H03B 27/00* (2006.01)

(52) U.S. Cl. .................. 331/57; 331/45; 331/46

(58) Field of Classification Search .......... 331/57, 331/46, 45

See application file for complete search history.

(56) References Cited

U.S. PATENT DOCUMENTS 5,635,877 A * 6/1997 Monk et al. ............... 331/57
5,677,650 A * 10/1997 Kwasniewski et al. ...... 331/57
6,426,662 B1 * 7/2002 Arcus ........................ 327/295
6,617,936 B1 * 9/2003 Dally et al. ................. 331/57
6,870,431 B1 * 3/2005 Afghahi ..................... 331/57

OTHER PUBLICATIONS

Retdian, Nicodimus; Takagi, Shigetaka; and Fujii, Nobuo, Voltage Controlled Ring Oscillator with Wide Tuning Range and Fast Voltage Swing, 4 pgs., Tokyo, Japan.

* cited by examiner

*Primary Examiner*—Robert Pascal
*Assistant Examiner*—James Goodley
(74) *Attorney, Agent, or Firm*—Alan K. Stewart; W. James Brady, III; Frederick J. Telecky, Jr.

(57) ABSTRACT

An oscillator circuit comprises a plurality of ring oscillators wherein each ring oscillator produces an oscillatory output signal. The ring oscillators are cross-coupled such that each ring oscillator drives only one other ring oscillator. In at least one embodiment, the oscillator circuit comprises four, three-stage ring oscillators. As such, each ring oscillator comprising three cells (e.g., inverters or delay elements). Further, in this embodiment, the oscillator circuit produces a four phase clock comprising the oscillatory output signals from each of the four ring oscillators.

11 Claims, 2 Drawing Sheets

CROSS COUPLED VOLTAGE CONTROLLED OSCILLATOR

BACKGROUND

1. Technical Field

The present subject matter relates generally to voltage controlled oscillators. More particularly, the present subject matter relates to a cross coupled voltage controlled oscillator architecture.

2. Background Information

A voltage controlled oscillator ("VCO") is an electrical circuit that produces an oscillatory output voltage. VCOs are used in a wide variety of analog and digital circuits. VCOs are commonly used in phase lock loop ("PLL") and clock generator circuits and are frequently used in data communication equipment.

In at least one implementation, a VCO comprises multiple delay elements serially connected in a "ring." That is, the output of each delay element feeds into the input of the next delay element in series and the output of the last delay elements loops back and feeds into the input of the first delay element. This configuration is also known as a "ring oscillator."

The output of each delay element in a ring oscillator, not only is provided to the next delay element in series, but also comprises an output clock signal. The frequency of the clock signals are all generally the same within a ring oscillator, but the phase varies from clock signal to clock signal in the circuit.

A ring oscillator oscillates at a particular frequency that generally is inversely proportional to the number of delay elements comprising the ring. A ring oscillator that is based on single-ended signaling typically includes an odd number of delay elements greater than or equal to three. All else being equal, a three stage ring oscillator has a higher oscillation frequency than a five stage ring oscillator which, in turn has a higher oscillation frequency than a seven stage ring oscillator, and so on. For many applications, such as data communications, ring oscillators with higher oscillation frequencies are preferred over ring oscillators with lower oscillation frequencies. A three-stage ring oscillator produces three clock signals varying in phase by 120 degrees. A five-stage ring oscillator produces five clock signals varying in phase by 72 degrees, and so on.

The desire for fast speeds encourages a system designer toward ring oscillator implementations with only three stages. However, in some applications such as data communications, a three-stage ring oscillator is undesirable because the clock signals produced by a three stage ring oscillator are incompatible with the application. Data communications, for example, frequently use a four-phase clock scheme. That is, four clock signals are used all having the same frequency but having phases varying by 90 degrees from clock to clock. Thus, one clock has a phase of 0, while the other three clocks have relative phases of 90, 180 and 270 degrees. A three-stage ring oscillator is fast, which is desirable, but produces clocks having phases that vary by 120 degrees, which is not desirable for some applications. A solution to this problem is desirable.

BRIEF SUMMARY

As disclosed herein, an oscillator circuit comprises a plurality of ring oscillators wherein each ring oscillator produces an oscillatory output signal. The ring oscillators are cross-coupled such that each ring oscillator drives only one other ring oscillator. In at least one embodiment, the oscillator circuit comprises four, three-stage ring oscillators. As such, each ring oscillator comprising three cells (e.g., inverters or delay elements). Further, in this embodiment, the oscillator circuit produces a four-phase clock comprising the oscillatory output signals from each of the four ring oscillators.

In accordance with another embodiment, a method comprises providing a plurality of ring oscillators and cross-coupling the ring oscillators such that each ring oscillator drives one and only one other ring oscillator. These and other embodiments are described below.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to."Also, the term "couple" or "couples" is intended to mean either an indirect or direct connection. Thus, if a first device couples to a second device, that connection may be through a direct connection, or through an indirect connection via other devices and connections. As used herein, the terms voltage controlled oscillator ("VCO") and "ring oscillator" may be used synonymously.

BRIEF DESCRIPTION OF THE DRAWINGS

For a more detailed description of the preferred embodiments of the present invention, reference will now be made to the accompanying drawings, wherein.

DETAILED DESCRIPTION OF THE PREFERRED EMBODIMENTS

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary, of that embodiment, and not intended to intimate that the scope of the disclosure, including the claims, is limited to that embodiment.

Figure 1:
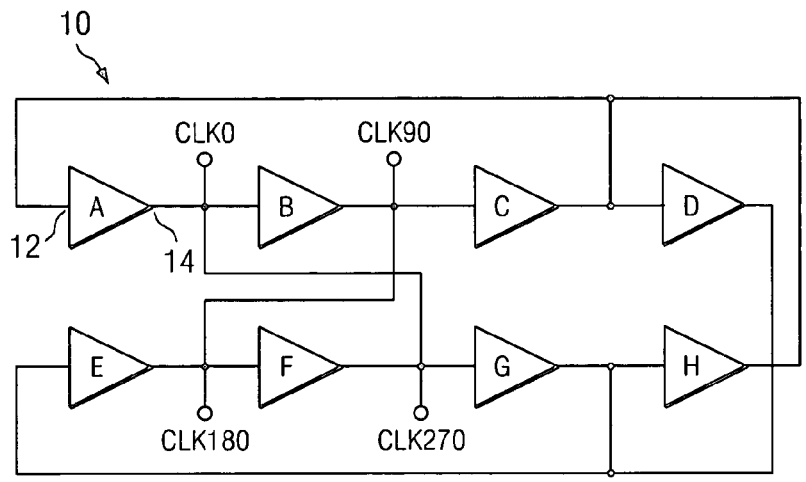
FIG. 1 shows a cross coupled VCO in accordance with the preferred embodiments of the invention.

Referring now to FIG. 1, a preferred embodiment of an oscillator circuit 10 comprises a plurality of cells designated as A, B, C, D, E, F, G, and H. Eight cells A–H are shown in FIG. 1, but in other embodiments, such as that of FIG. 5 discussed below, a different number of cells can be provided. Each cell A–H may be implemented as an inverter or a delay element. Each cell has an input and an output. For example, cell A has an input 12 and an output 14. As shown in the preferred embodiment of FIG. 1, the cells are coupled in series with the output of each cell being coupled to the input of the next cell in series. The output of cell A connects to the input of cell B. The output of cell B connects to the input of cell C. The output of cell C connects to the input of cell D. The output of cell D connects to the input of cell E. The output of cell E connects to the input of cell F. The output of cell F connects to the input of cell G. The output of cell G connects to the input of cell H. Various other connections are also shown in FIG. 1. The outputs of cells C and G loop back and connect to the inputs of cells A and E, respectively. The outputs of cells D and H couple to the inputs of cells H and D, respectively. Further, the outputs of cells B and F couple to the inputs of cells F and B, respectively.

The oscillator circuit 10 shown in FIG. 1 comprises a plurality of ring oscillators, specifically four ring oscillators. Each ring oscillator comprises three stages. The four, three-stage ring oscillators in the oscillator circuit 10 are (denoted in terms of the reference labels A–H) ABC, EFG, AGH, and ECD. That is, one three-stage ring oscillator comprises cells A, B and C. Another three-stage ring oscillator comprises cells E, F, and G. The other two three-ring oscillators comprise elements A, G, and H and cells E, F, and G. Three-stage ring oscillator ABC is configured so that the output of cell A couples to the input of cell B. The output of cell B couples to the input cell C and the output of cell C loops back and couples to the input of cell A. Similarly, three-stage ring oscillator EFG is configured so that the output of cell E couples to the input of cell F. The output of cell F couples to the input cell G and the output of cell G loops back and couples to the input of cell E. Further still, three-stage ring oscillator AGH is configured so that the output of cell A couples to the input of cell G. The output of cell G couples to the input cell H and the output of cell H loops back and couples to the input of cell A. Finally, the three-stage ring oscillator ECD is configured so that the output of cell E couples to the input of cell C. The output of cell C couples to the input cell D and the output of cell D loops back and couples to the input of cell E.

As noted above, the frequency of oscillation of a ring oscillator is inversely proportional to the number of stages comprising the ring oscillator. Because the ring oscillators in the oscillator circuit 10 comprise only three cells (stages), the ring oscillators are capable of higher oscillation frequencies than if more than three stages are used.

Each ring oscillator produces an oscillatory output signal. The oscillator circuit 10 of FIG. 1 preferably produces four output signals, also called clocks. The output clocks comprise the output of cells A, B, E, and F. The four output clocks all have exactly or approximately the same frequency, but differ in phase. The phase difference between the clocks is an integer multiple of 90 degrees. The output of cell A is referred as "CLK0" to indicate 0 degrees. The output of cell B is referred to as "CLK90" to indicate 90 degrees. Similarly, the outputs of cells E and F are referred to as "CLK180" and CLK270" to indicate 180 and 270 degrees, respectively. The preferred oscillator architecture depicted in FIG. 1 thus produces a four-phase clock (CLK0, CLK90, CLK180, and CLK270) while using only three-stage ring oscillators. Three-stage ring oscillators permits high speed clocks to be produced, while the architecture of FIG. 1 produces a quadrature clock set.

The four, three-stage ring oscillators are cross-coupled as shown in FIG. 1. The ABC ring oscillator couples to the ECD ring oscillator. Specifically, the output of cell C in the ABC ring oscillator drives the input of cell D in the ECD ring oscillator. The output of cell G in the EFG ring oscillator drives the input of cell H in the AGH ring oscillator. The output of cell A in the AGH ring oscillator drives the input of cell B in the ABC ring oscillator. Finally, the output of cell E in the ECD ring oscillator drives the input of cell F in the EFG ring oscillator. The four, three-stage ring oscillators are thus cross-coupled in such a way that each ring oscillator drives only one other ring oscillator. Because each ring oscillator drives one and only one other ring oscillator, the loading on each ring oscillator and cell is minimized which further enables the high-speed nature of the oscillator circuit 10.

Figure 2:
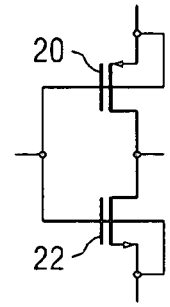
FIG. 2 shows an exemplary embodiment of each of the cells in the cross coupled VCO of FIG. 1.

As noted above, each cell A–H may comprise an inverter or a delay element. An example of an inverter is shown in FIG. 2. As shown in FIG. 2, each element may be configured as a pair of transistors 20 and 22 coupled together to form an inverter. Transistor 20 may comprise an n-channel metal oxide semiconductor (n-MOS) transistor and transistor 22 may comprise a p-channel metal oxide semiconductor (p-MOS) transistor.

Figure 3:
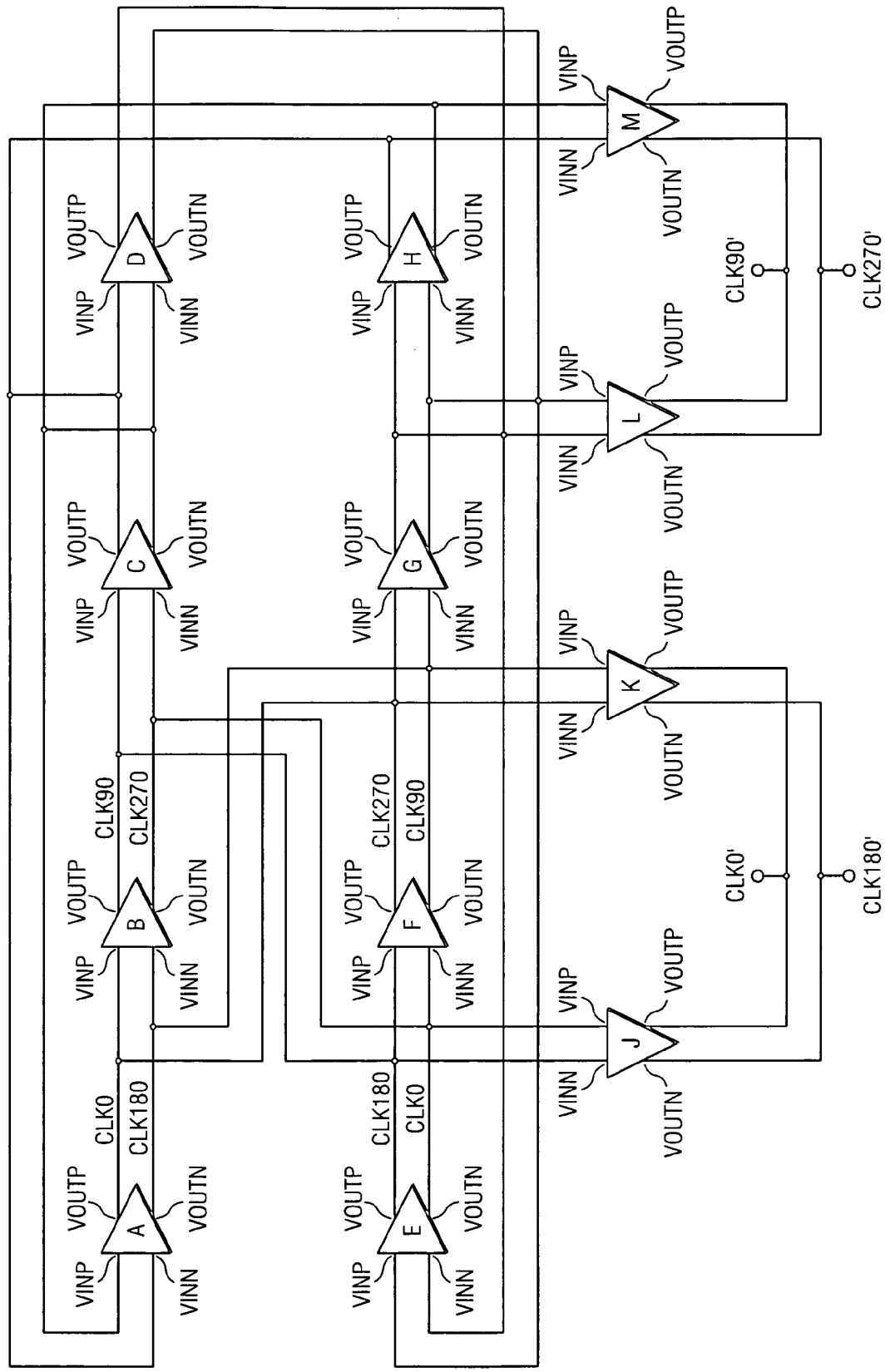
FIG. 3 shows an exemplary embodiment of a cross coupled VCO that implements differential signaling.

The embodiments depicted in FIGS. 1 and 2 implement single-ended signaling. FIG. 3 provides a preferred embodiment of the invention implementing differential signaling. FIG. 3 shows a similar architecture to that of FIG. 1. Cells A–H in FIG. 3 are shown connected in much the same as way cells A–H in FIG. 1. That is, the architecture of FIG. 3 includes four, 3-stage ring oscillators, namely, ABC, EFG, AGH, and ECD. As in FIG. 1, each ring oscillator in FIG. 3 drives one and only one other ring oscillator. High speed is thus obtained.

Each cell in FIG. 3 includes a pair of differential inputs VINP and VINN and a pair of differential outputs VOUTP and VOUTN. As can be seen, the VOUTP output from one cell connects to the VINP of the next cell in the series A-B-C-D and E-F-G-H. Similarly, the VOUTN output connects to the VINN of the next cell in the series noted above. The VOUTP outputs of cells C and G loop back and connect to the VINP inputs of cells A and E, respectively. The VOUTN outputs of cells C and G loop back and connect to the VINN inputs of cells A and E, respectively. Further, the VOUTP outputs of cells B and F connect to the VINP inputs cells F and B, respectively, and the VOUTN outputs of cells B and F connect to the VINN inputs cells F and B.

The quadrature clocks CLK0, CLK90, CLK180, and CLK270 are generated on the VOUTP outputs of cells A, B, E, F, respectively. Because the signaling scheme in FIG. 3 is differential, the corresponding output signal from each cell is the inverse clock signal. Thus, while the VOUTP signal from cell A is the CLK0 signal, the VOUTN signal from cell A is the CLK180 clock. Similarly, the VOUTN outputs of cells B, E, and F are the CLK270, CLK0, and CLK90 clocks. As such, the differential signaling in the architecture of FIG. 3 results in two of each of the CLK0, CLK90, CLK180, and CLK270 clocks. The rising and falling edges of these pairs of comparable clocks may not coincide exactly due to differences in tolerances between the various cells. To ameliorate the effects of any such differences in timing, cells J, K, L, and M are provided. Cell J receives the outputs from cell E. Cell K receives the outputs from cell F. Cell L receives the outputs of cell G. Finally, cell M receives the outputs from cell H. The VOUTP outputs from cells J and K are connected together as are the VOUTN outputs. Similarly, the VOUTP and VOUTN outputs from cells L and M are connected together. The quadrature clocks from the circuit of FIG. 3 are taken as the CLK0', CLK90', CLK180', and CLK270'. Cells J–M are thus provided to eliminate or at least reduce any timing differences among the various differentially generated common clock signals.

Figure 4:
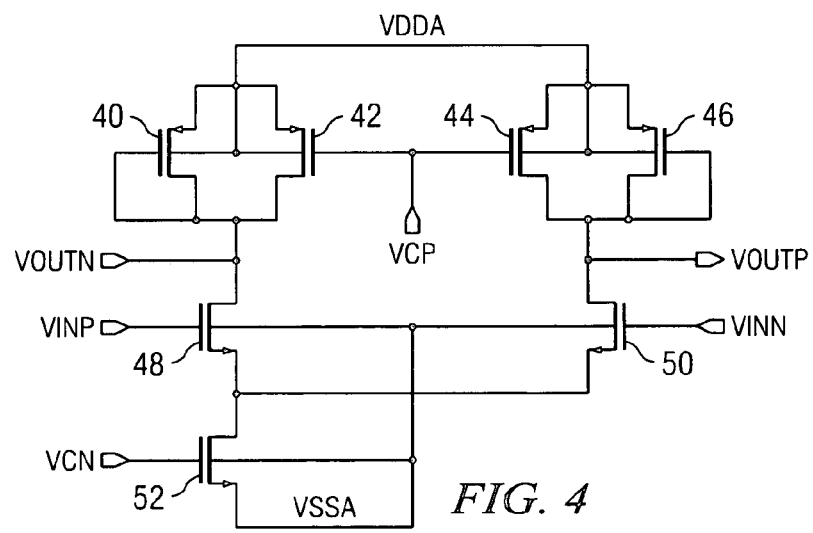
FIG. 4 shows an exemplary embodiment of each cell of FIG. 3.

FIG. 4 shows an exemplary embodiment of each differential cell A–M in FIG. 3. As shown in FIG. 4, each differential cell comprises seven transistors 40, 42, 44, 46, 48, 50, and 52. Transistors 40, 42, 44, and 46 preferably are p-MOS transistors while transistors 48, 50, and 52 preferably are n-MOS transistors. Transistors 48 and 50 form a differential input transistor pair. Transistors 40, 42 and 44, 46 function as load resistors. Transistor 52 functions as a current source. The VCP node provides a bias voltage for the p-MOS transistors. The VCN node provides a bias voltage for the n-MOS transistor 52. The VCP nodes are connected together among the various cells A through D, E through H, and I through L, but these connections are not shown in FIG. 3. FIG. 4 also illustrates that the power supply voltages are provided as VDDA and VSSA, which also are not shown in FIG. 3.

Figure 5:
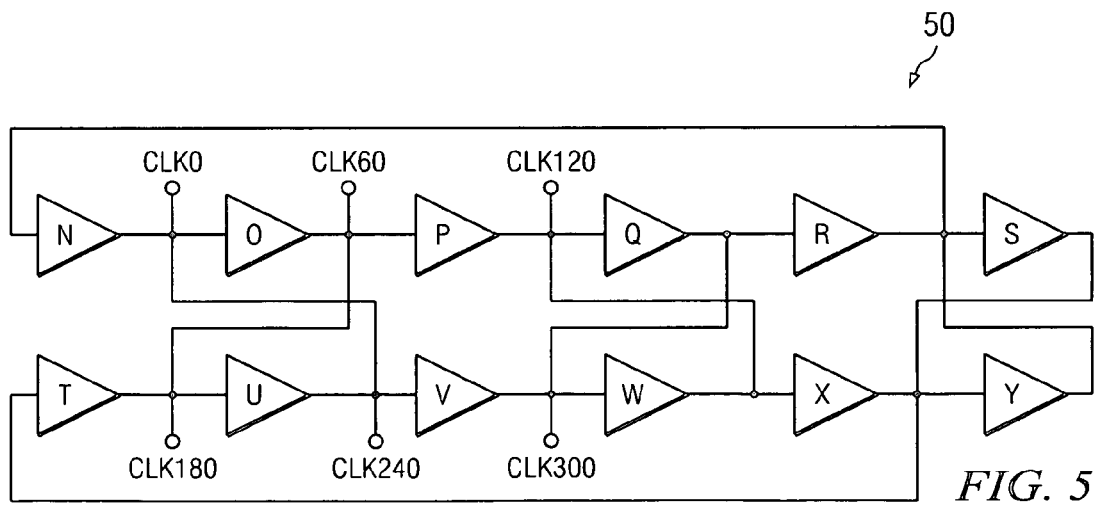
FIG. 5 illustrates how the cross coupled VCO of FIG. 1 can be scaled to produce any desired number of clock signals.

The embodiments discussed above can be scaled to provide more than four clock signals. FIG. 5, for example, shows a system 50 comprising 12 cells N, O, P, Q, R, S, T, U, V, W. X, and Y. The configuration of the cells is similar to that described above. For example, the output cells O and U are cross-coupled to the inputs of cells U and O, respectively. Cells Q and W are similarly cross-coupled as are cells S and Y. By extending the number of cross-coupled cells, additional clocks can be generated. In the embodiment of FIG. 5, system 50 comprises six clock signals whose phases are generally 60 degrees apart. As shown, system 50 includes CLK0, CLK60, CLK120, CLK180, CLK240, and CLK300 provided as the output signals from cells N, O, P, T, U, and V. Additional groups of cross-coupled cells can be provided as well. Further, both the single-ended or differential signaling embodiments described above can be scaled in this manner.

The oscillator circuits described herein are useful in a variety of electronic systems. A data communication device is one example of a system in which the preferred oscillator circuits are useful. Data communication devices often require or benefit from quadrature, high speed clocks such as those generated by the preferred embodiments of the oscillator circuit. The preferred oscillator circuits may be included in a receiver or/or transmitter element within a data communication device.

While the preferred embodiments of the present invention have been shown and described, modifications thereof can be made by one skilled in the art without departing from the spirit and teachings of the invention. The embodiments described herein are exemplary only, and are not intended to be limiting. Accordingly, the scope of protection is not limited by the description set out above.

What is claimed is:

1. An oscillator circuit, comprising:
   more than two ring oscillators,
   wherein each ring oscillator produces an oscillatory output signal; and
   wherein the ring oscillators are directly cross coupled such that each ring oscillator drives only one other ring oscillator.

2. The oscillator circuit of claim 1 wherein each ring oscillator comprises three stages.

3. The oscillator circuit of claim 2 wherein each stage comprises an inverter or a delay element.

4. The oscillator circuit of claim 1 wherein the oscillator circuit comprises four ring oscillators, each ring oscillator comprising three stages, and wherein the oscillator circuit produces a four phase clock comprising the oscillatory output signals from each of the four ring oscillators.

5. The oscillator circuit of claim 4 wherein the four oscillatory output signals vary in phase by 90 degrees.

6. The oscillator circuit of claim 1 wherein the plurality of ring oscillators comprise a first cell, a second cell, a third cell, a fourth cell, a fifth cell, a sixth cell, a seventh cell and an eight cell, each cell having an input and an output and wherein the output of the first cell connects to the inputs of the second seventh cells, the output of the second cell connects to the input of the third and fifth cells, the output of the third cell connects to the input of the fourth and first cells, the output of the fourth cell connects to the input of the fifth and eight cells, the output of the fifth cell connects to the input of the sixth cell, the output of the sixth cell connects to the input of the seventh cell, and the output of the seventh cell connects to the inputs of the eight and fifth cells.

7. The oscillator circuit of claim 1 wherein the plurality of ring oscillators implement differential signaling and the oscillator circuit further comprises a plurality of cells coupled to the ring oscillators and whose purpose is to reduce timing differences among at least some of the oscillator output signals.

8. A method, comprising:
   providing more than two ring oscillators; and
   directly cross-coupling the ring oscillators such that each ring oscillator drives one and only one other ring oscillator.

9. The method of claim 8 wherein providing the plurality of ring oscillators comprises providing a plurality of three-stage ring oscillators.

10. The method of claim 9 further comprising providing quadrature clocks.

11. The method of claim 8 wherein providing the plurality of ring oscillators comprises providing four, three-stage ring oscillators.

* * * * *